US011582886B2

(12) United States Patent
Gao

(10) Patent No.: US 11,582,886 B2
(45) Date of Patent: Feb. 14, 2023

(54) MODULAR SERVER COOLING SYSTEM

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 16/782,279

(22) Filed: Feb. 5, 2020

(65) Prior Publication Data

US 2021/0243917 A1 Aug. 5, 2021

(51) Int. Cl.
*H05K 7/20* (2006.01)
(52) U.S. Cl.
CPC ..... *H05K 7/20718* (2013.01); *H05K 7/20754* (2013.01); *H05K 7/20763* (2013.01)
(58) Field of Classification Search
CPC ........... H05K 7/20718; H05K 7/20763; H05K 7/20754
USPC ....................................................... 361/695
See application file for complete search history.

(56) References Cited

U.S. PATENT DOCUMENTS

| | | | | |
|---|---|---|---|---|
| 6,828,675 B2 * | 12/2004 | Memory | ............ | H05K 7/20681 165/104.33 |
| 2003/0156385 A1 * | 8/2003 | Askeland | ................ | G06F 1/182 361/679.51 |
| 2004/0008483 A1 * | 1/2004 | Cheon | ........................ | G06F 1/20 361/679.53 |
| 2005/0168938 A1 * | 8/2005 | Bash | .................. | H05K 7/20772 361/679.48 |
| 2007/0201210 A1 * | 8/2007 | Chow | ................ | H05K 7/20772 361/704 |
| 2007/0274043 A1 * | 11/2007 | Shabany | ............ | H05K 7/20781 361/696 |
| 2009/0154104 A1 * | 6/2009 | Kondo | ................ | H05K 7/20809 361/700 |
| 2011/0313576 A1 * | 12/2011 | Nicewonger | ........... | F28D 15/00 700/282 |
| 2016/0128238 A1 * | 5/2016 | Shedd | ..................... | F25B 41/40 361/679.47 |
| 2016/0273996 A1 * | 9/2016 | Alshinnawi | .......... | F24F 11/0001 |
| 2018/0231295 A1 * | 8/2018 | Akiyama | .............. | H01L 23/427 |
| 2020/0249732 A1 * | 8/2020 | Nakamura | .......... | H05K 7/20218 |

FOREIGN PATENT DOCUMENTS

GB 2467805 A * 8/2010 ............. B65B 63/08
JP 2004363308 A * 12/2004

* cited by examiner

*Primary Examiner* — Anatoly Vortman
*Assistant Examiner* — Zhengfu J Feng
(74) *Attorney, Agent, or Firm* — Womble Bond Dickinson (US) LLP

(57) ABSTRACT

A modular server design includes a server chassis, a cooling module within the server chassis housing at least one cooling unit, an electronics module within the server chassis holding a motherboard, and a cooling connecting panel. The cooling connecting panel includes a number of cooling channels to fluidly connect the at least one cooling unit of the cooling module with a cooling device on the motherboard. The cooling module includes components to enable proper heat and fluid transfer.

18 Claims, 7 Drawing Sheets

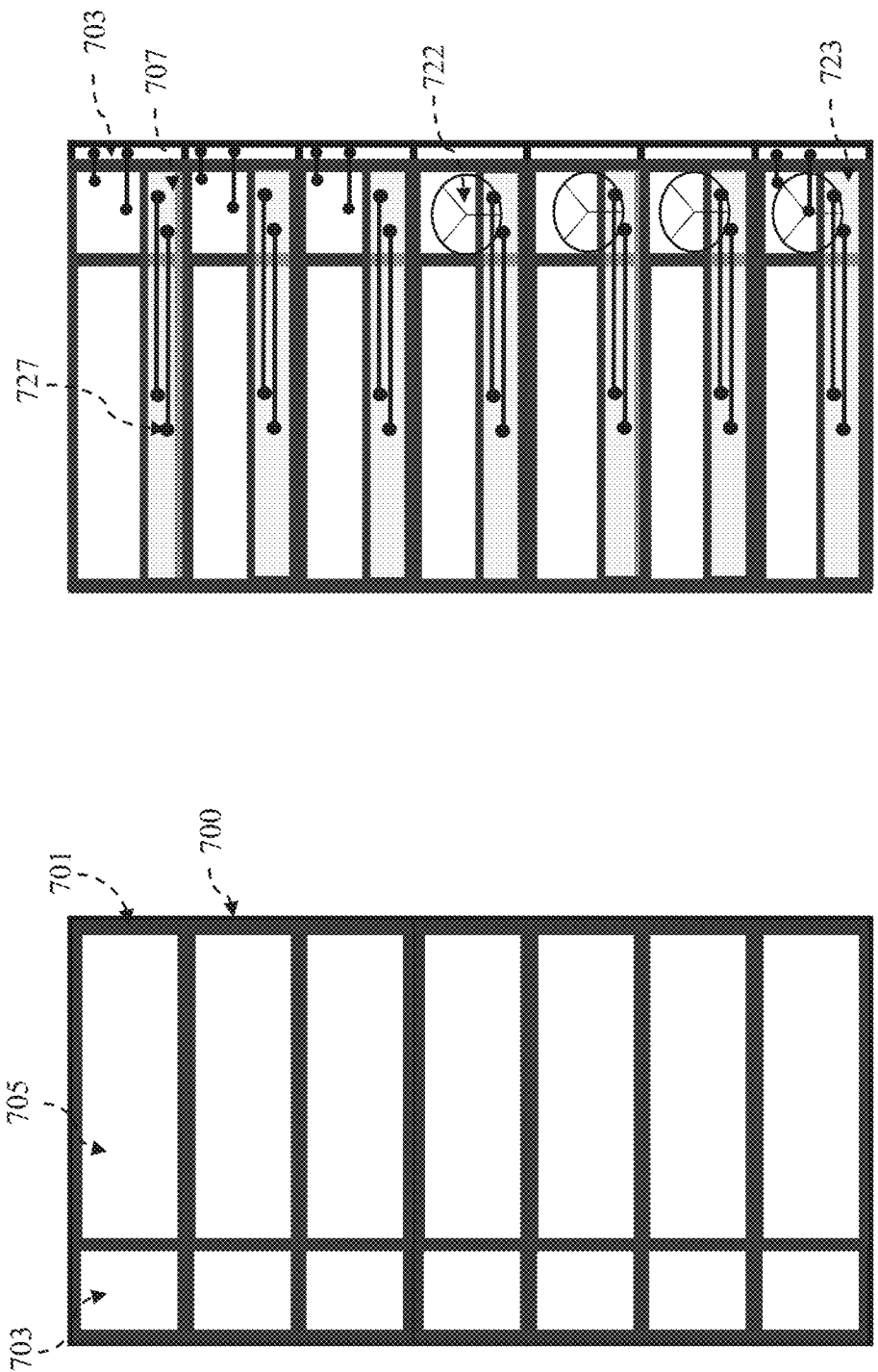

MODULAR SERVER COOLING SYSTEM

FIELD OF THE DISCLOSURE

Embodiments of the present invention relate generally to electronics and server cooling systems. More particularly, embodiments of the invention relate to a modular server cooling system.

BACKGROUND

Existing server cooling solutions often require installing cooling devices, such as cold plates or heat sinks, on most of the electronic components. For a lower power density heat sink solution, the heat sink devices may be implemented directly onto the electronics. However, for high density cold plate and heat sink solutions, especially heat sink solutions using heat pipes or vapor chambers, additional cooling hardware may be needed, such as a manifold, condenser, radiator etc. For example, for a high density heat sink design, a heat pipe and remote heat sink solution may occupy additional space on a motherboard. This raises challenges for the electrical design and layout of the motherboard, increases the design complexity, and decreases the design efficiency and reliability.

BRIEF DESCRIPTION OF THE DRAWINGS

Embodiments of the invention are illustrated by way of example and not limitation in the figures of the accompanying drawings in which like references indicate similar elements.

FIGS. 7A-7B illustrate front and rear views of a server rack populated with servers, according to embodiments of the present disclosure.

DETAILED DESCRIPTION

Figure 1:
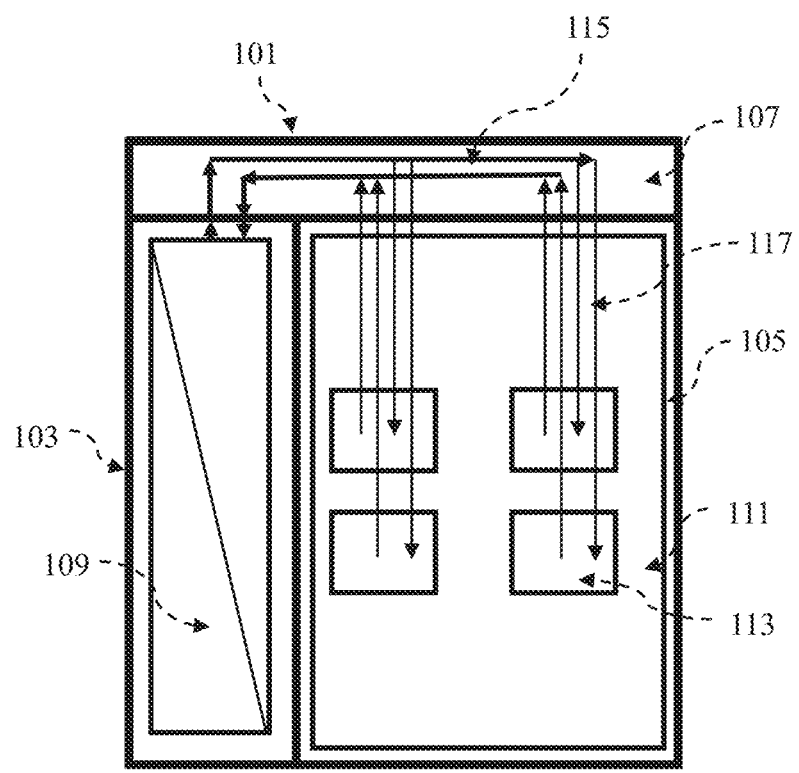
FIG. 1 shows a top view of a modular cooling system design, according to embodiments of the present disclosure.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

In the description of the embodiments provided herein, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other. Additionally, the terms "server," "client," and "device" are intended to refer generally to data processing systems rather than specifically to a particular form factor for the server, client, and/or device.

Electronics cooling is an important market for computing hardware and other electronic devices, such as CPU servers, GPU servers, storage servers, networking equipment, edge computing systems, on-vehicle computing boxes etc. These hardware products are the foundation of the daily operation of many businesses. Due to different business requirements and development needs, the design of hardware components and system packaging may need to change to continuously support the new operating requirements and new commercial use cases. Cooling these electronic components to ensure they function properly presents a number of challenges.

The cooling for servers requires continuous innovation, not only because of the dynamic variations of server design, but also the variations in cooling requirements. In some embodiments, cooling capacity requirements increase when the thermal load increases, even though the server design may remain the same. The cooling design is one of the key parts to ensure proper functioning of the server at different working conditions during its lifetime.

Embodiments described herein provide for a modular server design which segregates the cooling devices from a motherboard. This means that the design will enable removal of a majority of the cooling components from the main motherboard. The design also aims to enable to locate all the connecting parts away from the motherboard. The additional space needed for a remote heat sink, the corresponding piping, as well as fans, pumps, sensors, leak detection cables, and corresponding air baffles are freed up, making the main circuit board design more simple and less dependent on the thermal system.

In one embodiment, the techniques described herein provide improved reliability of the server cooling system by introducing a server cooling module which separates the major cooling components from the server motherboard. This separation of the major cooling components from the motherboard minimizes the impact of a cooling hardware failure on the sever. The techniques described herein also provide a flexible server design that allows implementation of different types of electronics cooling systems and cooling sources.

According to one embodiment, a modular server cooling design is disclosed that includes three major components: a cooling module, an electronics module, and a cooling connecting panel. According to embodiments of the present disclosure, the electronics module and cooling connecting panel can be designed as one unit. The cooling module can house one or more cooling units, the electronics module can house the motherboard, and the cooling connecting panel can house fluid channels that can connect the cooling devices located on the electronic components of the motherboard to the major cooling unit within the cooling module.

Cooling devices may be attached and fixed on the top of the electronics on the motherboard, and the heat extracted to the cooling devices can be transferred to the cooling connecting panel through one or more server cooling loops. The cooling connecting panel connects the server or electronics module cooling loop and the cooling module. The heat is transferred to the cooling module and extracted from the cooling module through cooling air or cooling liquid. Additional components such as fans, pumps and an air baffle may also be assembled within the cooling module, in some embodiments. In one embodiment, fixed hard piping is used for the loop connecting between the electronics module and the connecting modules, which significantly enhance reliability. The cooling module may be configured and customized for different server cooling requirements and facility availabilities. In some embodiments, the cooling module may also provide a full separation of the cooling fluid and major moving parts from the electronics. Airflow management can be individually designed for high power density components and low power density components.

In one embodiment, the three major components can be assembled to the main chassis from different directions. For example, the connecting panel could be installed from the rear side of the chassis. In alternative embodiments, the modules can be arranged on top of each other. In additional embodiments, the cooling module could be stacked on the bottom of or on top of the electronics module.

System Overview

FIG. 1 shows a top view of a modular cooling system design, according to embodiments of the present disclosure. In this embodiment, a server chassis 101 includes a cooling module 103, an electronics module 105, and a cooling connecting panel 107. The cooling module 103 includes a cooling unit 109, which may be a liquid cooling unit, an air cooling unit, or a hybrid cooling unit, according to various embodiments. The electronics module 105 houses the motherboard 111, and one or more cooling devices 113 are mounted or located on electronics of the motherboard 111.

The motherboard 111 may be assembled within the electronics module 105, and the cooling devices 113 can be placed on the top of the motherboard electronics. In some embodiments, these can be high power density electronics which may use enhanced heat sink (with heat pipes) or liquid cooling devices. The cooling devices 113 use cooling loops 117 to connect to the cooling channels 115 within the cooling connecting panel 107. The cooling loops 117 can be preassembled with the cooling connecting panel 107, in some embodiments. In one embodiment, the electronics module 105 and the cooling connecting panel 107 can be designed as one single unit, including any fluid mechanical connectors between the cooling channels 115 of the cooling connecting panel 107 and the cooling loops 117. In one embodiment, if pumps are needed for the system, they can be packaged within the cooling connecting panel 107 or the cooling module 103.

The internal cooling channels 115 of the cooling connecting panel 107 are used for recirculating and distributing cooling fluid between the cooling module 103 and the cooling devices 113. In some embodiments, the cooling module 103 can be considered as one part of the entire server chassis 101, while also being an independent and potentially removable module. In such embodiments, the cooling module 103 is removably attached to the chassis 101. The cooling unit 109 is assembled within the cooling module 103 and is connected to the cooling connecting panel 107 once it is assembled to the server chassis 101.

In some embodiments, the cooling module 103 and the cooling connecting panel 107 can include connectors that are used for fluidly connecting the cooling module 103 with the cooling connecting panel 107. In one embodiment, the connection method between the cooling module 103 and the cooling connecting panel 107 uses dripless blind mating quick disconnects. In the design illustrated in FIG. 1, all the additional cooling components are separated from the motherboard 111. In this design, the majority of the heat is transferred to the cooling module 103 and then extracted to external cooling sources, thus centralizing and transferring heat efficiently. It can be seen in this embodiment that no additional space is used on the motherboard 111 for the cooling unit 109, which enables more flexible electrical layout design without any limitations based on the thermal design impact. In one embodiment, the cooling loops 117 can be arranged on the side panels of the electronics module.

Figure 2:
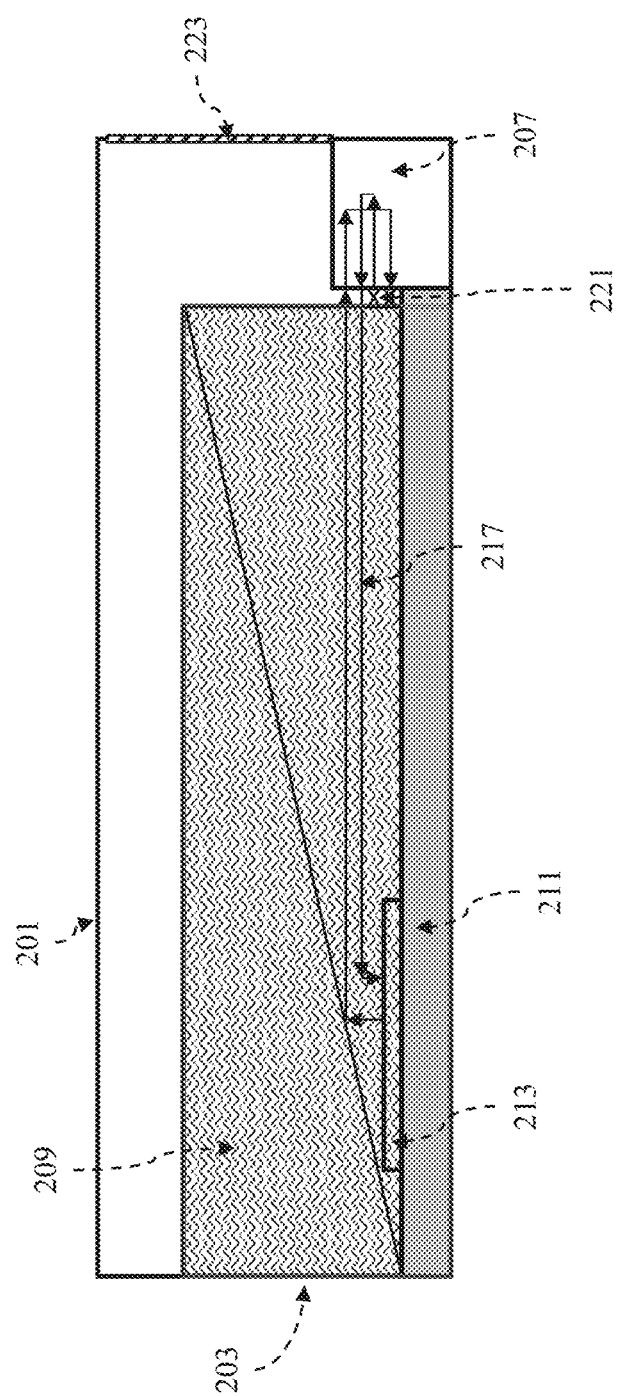
FIG. 2 shows a side view of the modular cooling system of FIG. 1, according to embodiments of the present disclosure.

FIG. 2 shows a side view of the modular cooling system of FIG. 1, according to embodiments of the present disclosure. In this embodiment, the cooling devices 213 assembled on the motherboard 211 connect to the cooling connecting panel 207 through cooling loops 217. Again, hard connection can be considered in this design if the motherboard layout as well as the cooling device design are fixed. The cooling module 203, which includes a cooling unit 209, is assembled to the server chassis 201. In this embodiment, the cooling module 203 is connected to the cooling connecting panel 207 through connectors 221. In some embodiments, either blind-mating or non-blind-mating connecting methods can be implemented here. An air vent 223 is positioned on the server chassis so that airflow can pass through the electronics module and the cooling module 203. In some embodiments, the cooling connecting panel 207 is designed to minimize blocking the airflow through the air vent 223. For ease of illustration, certain components are not illustrated in FIG. 2, such as a fan, pump, and leak detection devices. However, these and other components will be understood by those skilled in the art to be covered by the present disclosure.

Figure 3:
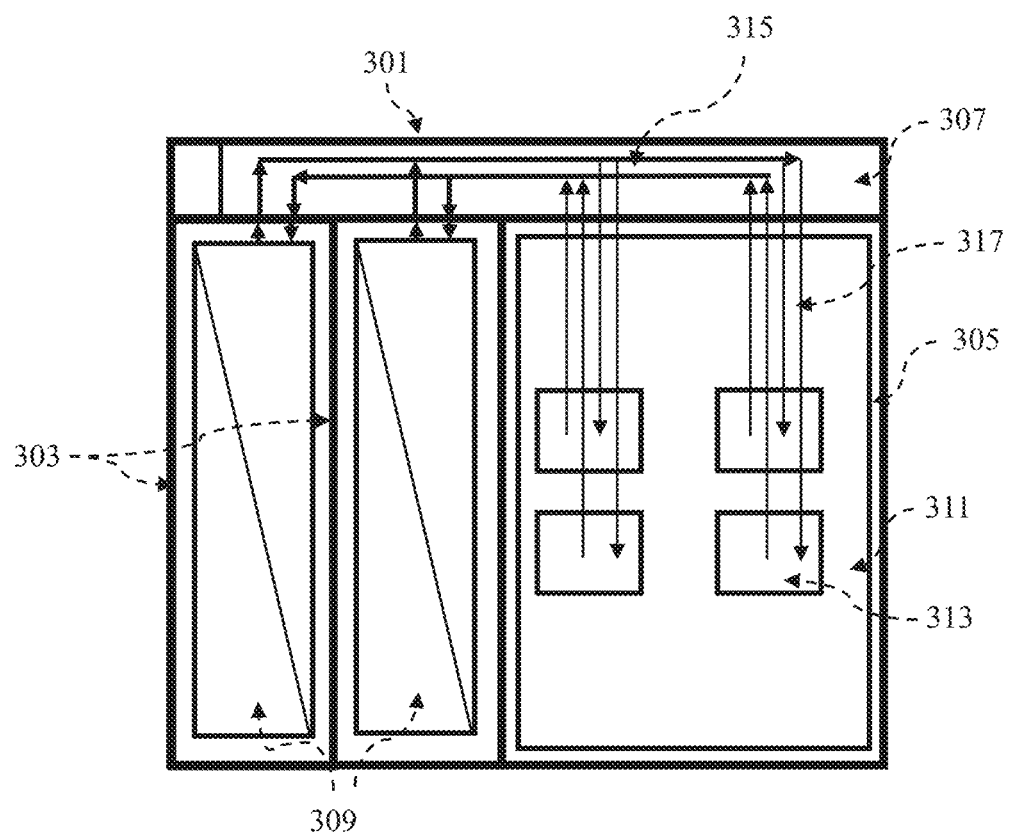
FIG. 3 shows a top view of another modular cooling system design, according to embodiments of the present disclosure.

FIG. 3 shows a top view of another modular cooling system design, according to embodiments of the present disclosure. In this embodiment, a server chassis 301 includes two cooling modules 303, an electronics module 305, and a cooling connecting panel 307. The cooling modules 303 include cooling units 309, which may be liquid cooling units, air cooling units, or hybrid cooling units, according to various embodiments. The electronics module 305 houses the motherboard 311, and one or more cooling devices 313 are mounted or located on electronics of the motherboard 311. The motherboard 311 may be assembled within the electronics module 305, and the cooling devices 313 can be placed on the top of the motherboard electronics. In some embodiments, these can be high power density electronics which may use enhanced heat sink (with heat pipes) or liquid cooling devices. The cooling devices 313 use cooling loops 317 to connect to the cooling channels 315 within the cooling connecting panel 307. The cooling loops 317 can be preassembled with the cooling connecting panel 307, in some embodiments. In one embodiment, the electronics module 305 and the cooling connecting panel 307 can be designed as one single unit, including any fluid mechanical connectors between the cooling channels 315 of the cooling connecting panel 307 and the cooling loops 317.

In this embodiment, multiple cooling modules 309 can be designed in a system for redundancy. The cooling connecting panel 307 can be modified for two or more cooling modules 309, in various embodiments. The current concept enables a flexible design for cooling the electronics with very limited impact on the major server design. In some embodiments, the cooling modules 309 can be a combination of air cooled and liquid cooled if the uptime of the server is extremely critical. This means any type of cooling source can be used for cooling the server. As an example, the cooling devices may be operated using different types of fluids, such as single phase and two-phase fluids; therefore, a separate cooling unit may be used in the chassis. This is useful to eliminate any impact in a major cooling failure, such as in a scenario where either the cooling liquid or cooling air fail.

Figure 4:
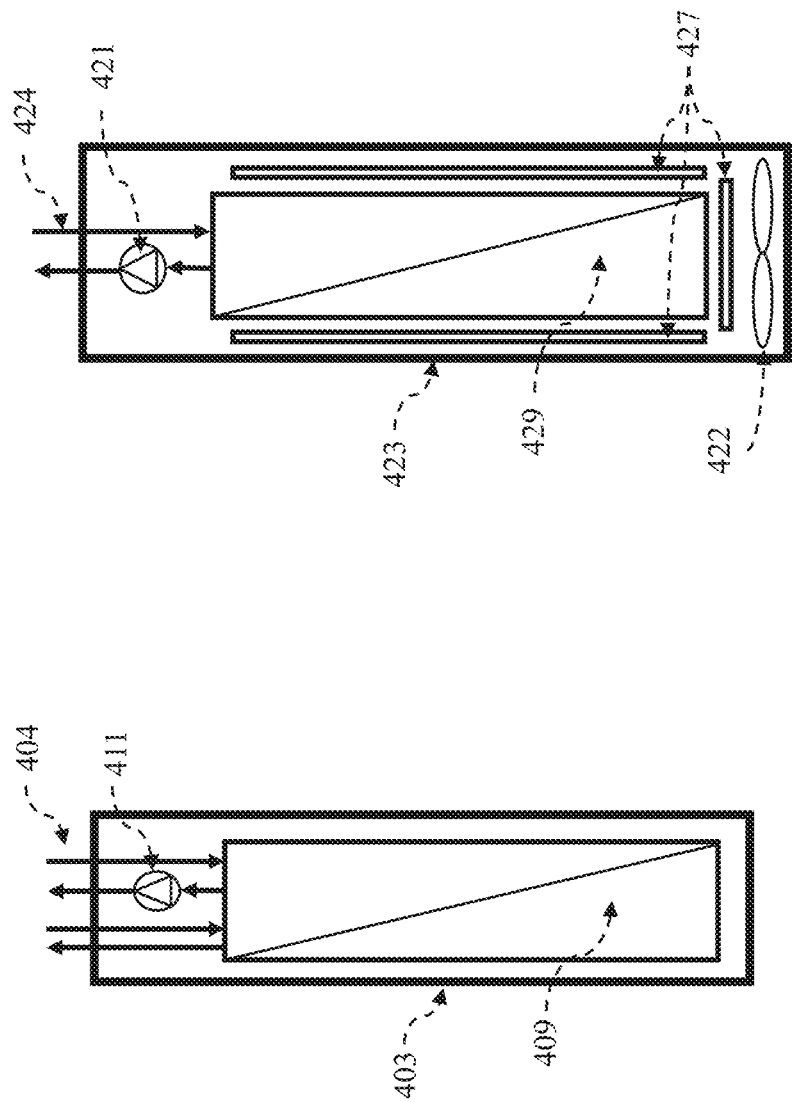
FIGS. 4A-4B show example cooling modules customized for different use cases, according to embodiments of the present disclosure.

FIGS. 4A-4B show example cooling modules 403, 423 customized for different use cases, according to embodiments of the present disclosure. In some embodiments, any customization of the cooling modules 403, 423 result in no impact on the server design. FIG. 4A shows a liquid cooled cooling module 403. The liquid cooled cooling module 403 can include an internal pump 411 assembled on an internal loop which is used for recirculating fluid between the cooling unit 409 and the cooling devices of the motherboard. By implementing the pump 409 with the cooling module 403, the entire server chassis reliability is increased, especially during a potential leak accident. The cooling unit 409 is also equipped with external and internal connectors 404 which are used for connecting with an external cooling fluid loop (e.g. within a cooling connecting panel). In some embodiments, these connectors 404 can be located in any location, such as the back side of the cooling module 403, as shown in FIG. 4A, or in the front side of the cooling module. In some embodiments, additional components, such as leak detection devices, can be added to the cooling module 403.

FIG. 4B illustrates an air cooled module 423. In the air cooled module 423, a fan or fan system 422 is used. In addition, an air baffle 427 may be used for better air flow management. The air cooled module 423 also includes an air-cooled heat exchanger 429. In some embodiments, the electronics module may also include one or more fans for cooling low power density devices. However, implementing a dedicated fan or fan system 422 for the cooling module helps manage the cooling air more efficiently. In some embodiments, a majority of the heat is centralized in the cooling module, and therefore a dedicated cooling module fan system 422 can increase efficiency. In some embodiments, no uniform airflow can be arranged for cooling different server chassis regions, with the cooling module region using a larger air volume and the electronics module using a lower air volume.

In some embodiments, the air flow baffles 427 can have various designs and be located in different portions of the cooling module 423 in order to manage airflow through the air-cooled heat exchanger 429. In one embodiment, the air flow baffles 427 can be located around the air-cooled heat exchanger 429 in order to direct airflow through the heat exchanger. This placement prevents airflow from the fan system 422 from finding a path of less resistance by passing around the heat exchanger 429. In some embodiments, the air flow baffles 427 can be a structural part of the cooling module 423, or a part of the air-cooled heat exchanger 429.

Figure 5:
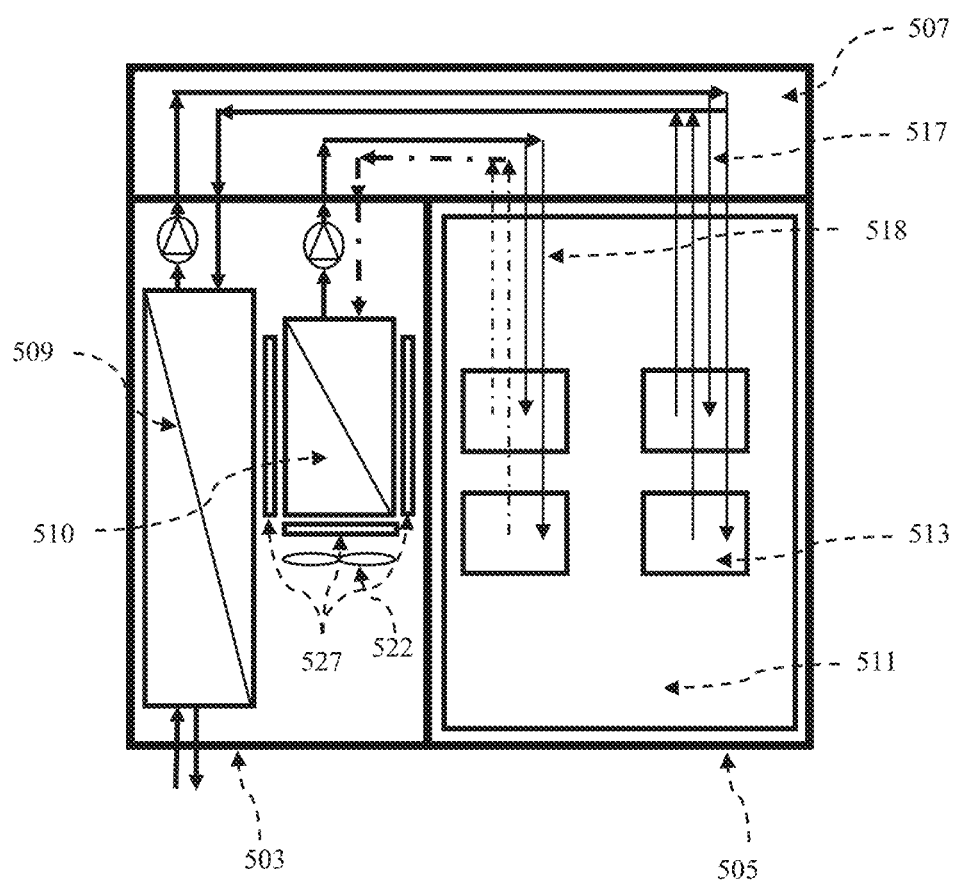
FIG. 5 shows a top view of another modular cooling system design, according to embodiments of the present disclosure.

FIG. 5 shows a top view of another modular cooling system design, according to embodiments of the present disclosure. In this embodiment, a server chassis 501 includes a cooling module 503 having a single phase cooling unit 509, as well as a two phase cooling unit 510. The chassis 501 also includes an electronics module 505 and a cooling connecting panel 507. The electronics module 505 includes a number of cooling devices 513 mounted or located on electronics of the motherboard 511. The motherboard 511 may be assembled within the electronics module 505, and the cooling devices 513 can be placed on the top of the motherboard electronics. The cooling devices 513 use a single phase cooling loop 517 and a two phase cooling loop 518 to connect to fluidly connect to the single phase cooling module 509 and the two-phase cooling module 510, respectively.

In some embodiments, one or more air flow baffles 527 are located within the cooling module 503 in order to direct airflow from a fan 522 to pass through the two phase cooling unit 510. The air flow baffles 527 can have various designs and be located in different portions of the cooling module 503 in order to manage airflow through the two phase cooling unit 510. In one embodiment, the air flow baffles 527 can be located around the two phase cooling unit 510 in order to direct airflow from the fan 522 through the two phase cooling unit 510. This placement of the air flow baffles prevents airflow from finding a path of less resistance by passing around the two phase cooling unit 510. In some embodiments, the air flow baffles 527 can be a structural part of the cooling module 503, or a part of the two phase cooling unit 510. In one embodiment, air flow baffles 527 may be necessary for any air cooled heat exchanger if used in a cooling module.

In some embodiments, different types of cooling devices 513 may be used on one server platform. For example, single phase cooling devices, two phase cooling devices, air cooling devices, and liquid cooling devices may coexist in a server. In such embodiments, the end cooling unit in the cooling module may be different for different cooling devices and their corresponding loops. In some embodiments, modifications can be made on the cooling connecting panel 507 in order to connect with single phase or two phase cooling devices. It can be seen in FIG. 5 that the single phase cooling loop 517 and two phase cooling loop 518 are designed to pass through the cooling connecting panel 507, and individual cooling units 509 and 510 are used for each of the loops. A first cooling unit 509 is a liquid cooled one, and a second cooling unit 510 is an air cooled one. This embodiment illustrates that the separation of the cooling and electronics provides a very flexible design for different use cases, with minimal limitations applied to the cooling method selection, as well as very minimal impact on a circuit board design and layout.

Figures 6A, 6B:
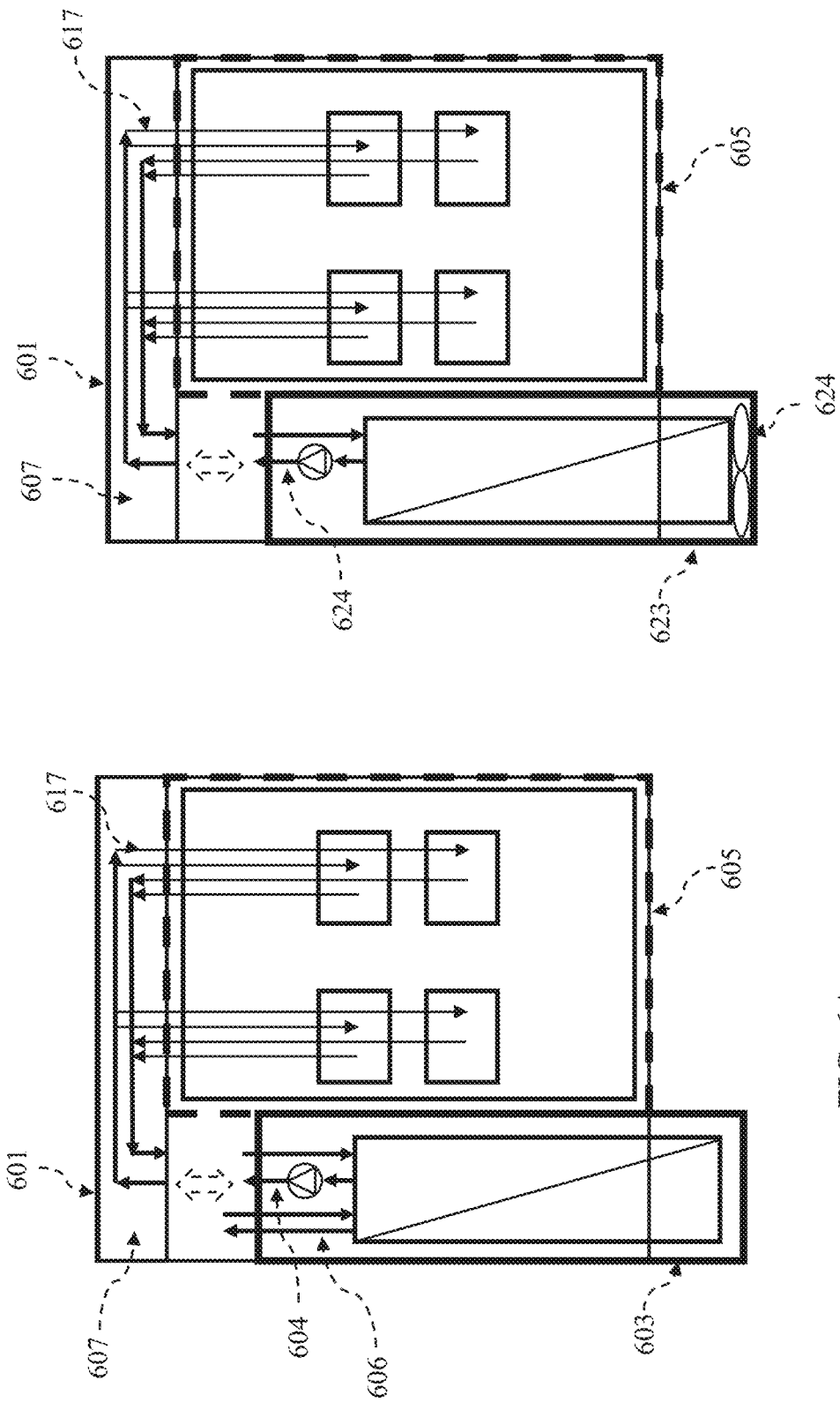
FIGS. 6A-6B illustrate the replacement of cooling modules, according to embodiments of the present disclosure.

FIGS. 6A-6B illustrate the replacement of cooling modules, according to embodiments of the present disclosure. In some embodiments, by replacing the cooling module, a server can be modified to either a liquid cooled or air cooled server to be able to deploy in different types of data centers. In the cloud services business, it is a very common requirement to move a physical server from one data center to another. Different data centers may have different types of cooling sources available. By swapping a cooling module, the server can be deployed in any data center or rack. FIG. 6A shows a liquid cooling module 603 being assembled within a server chassis 601. In this embodiment, the server chassis 601 includes a cooling connecting panel 607 and an electronics module 605 (the electronics module is outlined in broken lines in FIGS. 6A-6B). Within the cooling connecting panel 607 is a series of channels 617 for directing fluid (either gas or liquid) between the cooling modules 603 or 623 and the electronics module 605. FIG. 6B shows an air cooled cooling module 623 being assembled within the server chassis 601. In this embodiment, each of the cooling modules 603, 623 includes connectors 604 and 624 for fluidly connecting with the channels 617 of the cooling connecting panel 607. In some embodiments, additional connecting ports 606 can be used to connect to a rack and/or data center cooling source, when a liquid to liquid heat exchanger is used in 623. If only an air to liquid heat exchanger is used in 623, no connecting ports 606 may be needed. These additional connecting ports 606 can be in any location on the cooling module 603, in various embodiments.

FIGS. 7A-7B illustrate front and rear views of a server rack 700 populated with server chassis 701, according to embodiments of the present disclosure. In some embodiments, the cooling module 703 is similar to a power supply unit (PSU) module for a standard server. The cooling module 703 and/or the electronics module 705 can be preassembled with the server chassis 701 before populating on the rack 700, or it can be installed after the server chassis 701 is populated to the rack 700. The server chassis 701 can be removably mounted within the rack 700, in some embodiments. FIG. 7A shows a front view of the rack 700. In some embodiments, the fluid connectors are designed on the rear side of the rack 700. However, in some use cases or some other customization considerations, the connectors, including the cooling connecting panel 707, cooling module fluid supply, and return can be in the front side of the rack. FIG. 7B shows an example of a rear side of the rack presenting how the system is implemented in a rack environment. It can be seen that the loop connectors 727 are inside of the cooling connecting panel 707, and the cooling modules 703 are connected to the connecting panel 707 in each server.

From the top of the rack, the top three chassis are equipped with liquid cooled cooling modules, and the fourth-sixth cassis from the top are equipped with air cooled cooling modules. The air cooled cooling modules include a fan or fan system 722. The bottom chassis is equipped with a hybrid cooled cooling module 723. In some embodiments, the modular design disclosed herein enables different types of cooling methods for different types of servers to coexist in one rack. This significantly improves the process of relocating physical servers in the cloud business.

One skilled in the art would recognize that various adjustments can be made to the system within the scope of this disclosure. The following clauses and/or examples pertain to specific embodiments or examples thereof. Specifics in the examples may be used anywhere in one or more embodiments. The various features of the different embodiments or examples may be variously combined with some features included and others excluded to suit a variety of different applications. Examples may include subject matter such as a method, means for performing acts of the method, at least one machine-readable medium including instructions that, when performed by a machine cause the machine to performs acts of the method, or of an apparatus or system according to embodiments and examples described herein. Various components can be a means for performing the operations or functions described.

One embodiment provides for a modular server design. The modular server includes a server chassis; a cooling module within the server chassis housing at least one cooling unit; an electronics module within the server chassis holding a motherboard; and a cooling connecting panel including a number of cooling channels to fluidly connect the cooling unit of the cooling module with a cooling device on the motherboard. In some embodiments, the cooling module houses two or more cooling units. In some embodiments, at least one of the cooling units is a hybrid two-phase cooling unit. In some embodiments, the cooling module is removably attached to the server chassis. In some embodiments, the cooling connecting panel includes a number of connectors to fluidly connect with channels of the removable cooling module. In some embodiments, the modular server also includes a plurality of air vents positioned on the server chassis for creating airflow through the cooling module. In some embodiments, the modular server also includes a fluid pump positioned within the cooling module and associated with the at least one cooling unit. In some embodiments, the modular server also includes air baffles within the cooling module. In some embodiments, the modular server also includes a fan within the cooling module. In some embodiments, the modular server also includes a plurality of connecting ports on the cooling module to fluidly connect to a rack or data center cooling source.

Another embodiment provides for a modular server rack. The modular server rack includes a number of a server chassis removably mounted within the modular server rack. Each of the server chassis includes: a cooling module within the server chassis housing at least one cooling unit; an electronics module within the server chassis holding at least one motherboard; and a cooling connecting panel including a number of cooling channels to fluidly connect the cooling unit of the cooling module with a cooling device on the motherboard. In one embodiment, pumps are used within the cooling connecting panel. In some embodiments, the cooling module houses two or more cooling units. In some embodiments, at least one of the cooling units is a hybrid two-phase cooling unit. In some embodiments, the cooling module is removably attached to the server chassis. In some embodiments, the cooling connecting panel includes a plurality of connectors configured to fluidly connect with channels of the removable cooling module. In some embodiments, the cooling module also includes a plurality of air vents positioned on the server chassis for creating airflow through the cooling module. In some embodiments, the cooling module also includes a fluid pump positioned within the cooling module and associated with the at least one cooling unit. In some embodiments, the cooling module also includes air baffles within the cooling module. In some embodiments, the cooling module also includes a fan within the cooling module.

Another embodiment provides for a modular server chassis. The modular server chassis includes an electronics module within the server chassis holding a motherboard. The modular server chassis also includes a cooling connecting panel including a plurality of cooling channels to fluidly connect the cooling unit with a cooling device on the motherboard. The modular server chassis also includes a number of connectors within the cooling connecting panel to fluidly connect with channels of a removable cooling module.

In the foregoing specification, the invention has been described with reference to specific embodiments thereof. However, various modifications and changes can be made thereto without departing from the broader spirit and scope of the invention. The specification and drawings are, accordingly, to be regarded in an illustrative rather than a restrictive sense.

What is claimed is:

1. A modular server, comprising:
   a server chassis;
   a cooling module within the server chassis, the cooling module housing at least two cooling units configured to operate with fluids in different phases;
   an electronics module within the server chassis and separated from the cooling module, the electronics module holding at least one motherboard, the at least one motherboard housed within the electronics module and assembled with at least two cooling devices on top thereof, the at least two cooling devices independently removing heat from the at least one motherboard using the fluids in different phases; and
   a cooling connecting panel located within the server chassis and including a plurality of cooling channels providing a respective fluid connection between each of the at least two cooling units of the cooling module and each of the at least two cooling devices, the at least two cooling devices using a plurality of cooling loops to connect to the plurality of cooling channels, the cooling connecting panel separating the at least two cooling units from the at least two cooling devices on top of the at least one motherboard within the server chassis.

2. The modular server of claim 1, wherein at least one of the at least two cooling units is a hybrid two-phase cooling unit.

3. The modular server of claim 1, wherein the cooling module is removably attached to the server chassis.

4. The modular server of claim 3, wherein the cooling connecting panel includes a pump and a plurality of blind mating connectors configured to fluidly connect with a second plurality of cooling channels of the cooling module.

5. The modular server of claim 1, further comprising:
a plurality of air vents positioned on the server chassis for creating airflow through the cooling module.

6. The modular server of claim 1, further comprising:
a fluid pump positioned within the cooling module and associated with the at least two cooling units.

7. The modular server of claim 1, further comprising air baffles within the cooling module.

8. The modular server of claim 7, further comprising a fan within the cooling module.

9. The modular server of claim 1, further comprising a plurality of connecting ports on the cooling module to fluidly connect to a rack or data center cooling source.

10. A modular server rack, comprising:
a plurality of server chassis removably mounted, wherein each server chassis of the plurality of server chassis includes:
a cooling module housing at least two cooling units configured to operate with fluids in different phases;
an electronics module within each server chassis and separated from the cooling module, the electronics module holding at least one motherboard, the at least one motherboard housed within the electronics module and assembled with at least two cooling devices on top thereof, the at least two cooling devices independently removing heat from the at least one motherboard using the fluids in different phases; and
a cooling connecting panel located within each server chassis and including a plurality of cooling channels providing a respective fluid connection between each of the at least two cooling units of the cooling module and each of the at least two cooling devices, the at least two cooling devices using a plurality of cooling loops to connect to the plurality of cooling channels, the cooling connecting panel separating the at least two cooling units from the at least two cooling devices on top of the at least one motherboard within each server chassis.

11. The modular server rack of claim 10, wherein at least one of the at least two cooling units is a hybrid two-phase cooling unit.

12. The modular server rack of claim 10, wherein the cooling module is removably attached to each server chassis.

13. The modular server of claim 12, wherein the cooling connecting panel includes a plurality of connectors configured to fluidly connect with a second plurality of cooling channels of the cooling module.

14. The modular server rack of claim 10, wherein each server chassis further comprises:
a plurality of air vents positioned on the server chassis for creating airflow through the cooling module.

15. The modular server rack of claim 10, wherein the cooling module further comprises:
a fluid pump positioned within the cooling module and associated with the at least two cooling units.

16. The modular server rack of claim 10, wherein the cooling module further comprises:
air baffles within the cooling module.

17. The modular server rack of claim 10, wherein the cooling module further comprises:
a fan within the cooling module.

18. A modular server chassis comprising:
an electronics module within the modular server chassis holding a motherboard, the motherboard being housed within the electronics module and assembled with at least two cooling devices on top thereof, the at least two cooling devices independently removing heat from the motherboard using fluids in different phases;
a cooling connecting panel located within the server chassis and including a plurality of cooling channels providing a fluid connection between at least two cooling units of a removable cooling module and the at least two cooling devices on top of the motherboard, the at least two cooling units configured to operate with the fluids in different phases, each of the at least two cooling devices using a plurality of cooling loops to connect to the plurality of cooling channels, the cooling connecting panel separating the at least two cooling units from the at least two cooling devices on top of the motherboard within the modular server chassis; and
a plurality of connectors within the cooling connecting panel to fluidly connect with a second plurality of cooling channels of the removable cooling module.

* * * * *